United States Patent
Moodera et al.

(10) Patent No.: US 10,741,744 B2
(45) Date of Patent: Aug. 11, 2020

(54) SWITCHABLE SUPERCONDUCTING JOSEPHSON JUNCTION DEVICE FOR LOW ENERGY INFORMATION STORAGE AND PROCESSING

(71) Applicant: MASSACHUSETTS INSTITUTE OF TECHNOLOGY, Cambridge, MA (US)

(72) Inventors: Jagadeesh S. Moodera, Somerville, MA (US); Juan Pedro Cascales Sandoval, Somerville, MA (US); Yota Takamura, Cambridge, MA (US)

(73) Assignee: Massachusets Institute of Technology, Cambridge, MA (US)

( * ) Notice: Subject to any disclaimer, the term of this patent is extended or adjusted under 35 U.S.C. 154(b) by 126 days.

(21) Appl. No.: 16/139,938

(22) Filed: Sep. 24, 2018

(65) Prior Publication Data

US 2020/0111944 A1    Apr. 9, 2020

Related U.S. Application Data

(60) Provisional application No. 62/561,791, filed on Sep. 22, 2017, provisional application No. 62/686,903, filed on Jun. 19, 2018.

(51) Int. Cl.
*H01L 29/06* (2006.01)
*H01L 39/22* (2006.01)
(Continued)

(52) U.S. Cl.
CPC .......... *H01L 39/223* (2013.01); *H01L 39/025* (2013.01); *H01L 39/10* (2013.01); *H01L 39/121* (2013.01); *H01L 39/16* (2013.01)

(58) Field of Classification Search
CPC ..... H01L 43/065; H01L 43/04; H01L 39/223; H01L 39/025; H01L 39/121; H01L 39/16; H01L 39/10
(Continued)

(56) References Cited

U.S. PATENT DOCUMENTS

2017/0104151 A1* 4/2017 Banerjee ............... H01L 43/065

FOREIGN PATENT DOCUMENTS

| RU | 2013127417 A | * | 12/2014 |
| RU | 2554612 | | 6/2015 |
| RU | 2554612 C2 | * | 6/2015 |

OTHER PUBLICATIONS

Muduli, "Spin-Polarized Quasiparticle Control in a Double Spin-Filter Tunnel Junction," Physical Review B, vol. 96, No. 2, Jul. 1, 2017.
(Continued)

*Primary Examiner* — David S Blum
(74) *Attorney, Agent, or Firm* — Gesmer Updegrove LLP

(57) ABSTRACT

A switchable Josephson junction is provided that includes a plurality of ferromagnetic insulators that are defined by their respective magnetic alignments. A first superconducting layer that is positioned between any two of the ferromagnetic insulators, wherein the conductive state is controlled by the relative magnetization orientation of the ferromagnetic insulators where the first superconducting layer is superconducting when the two magnetizations are aligned in antiparallel but it turns normally conducting when the magnetic alignment is parallel. A second superconducting layer is adjacent one of the ferromagnetic layers, wherein Josephson tunneling occurs between the first superconducting layer and second superconducting layer across one of the ferromagnetic layers.

27 Claims, 13 Drawing Sheets

(51) Int. Cl.
   *H01L 39/02*   (2006.01)
   *H01L 39/12*   (2006.01)
   *H01L 39/16*   (2006.01)
   *H01L 39/10*   (2006.01)

(58) Field of Classification Search
   USPC .......................................................... 257/36
   See application file for complete search history.

(56) References Cited

OTHER PUBLICATIONS

Zhu, "Superconducting Exchange Coupling Between Ferromagnets", Nature Materials, vol. 16, No. 2, Sep. 19, 2016, pp. 195-199.

Xiao, "Proximity Effects in Superconducting/Insulating-Ferromagnet NbN/GdN Multilayers", Physical Review Letters, vol. 76, No. 10, Mar. 1, 1996, pp. 1727-1730.

Mattson, "Critical Fields of Fe4N/NbN Ferromagnetic/Superconducting Multilayers", Physical Review B, vol. 55, No. 1, Part 01, Jan. 1, 1997, pp. 70-73.

Osgood, "Coexistence of Magnetism and Superconductivity in Epitaxial GdN/W/NbN/W (100) and related NbN/W (100) Multilayers", Journal of Applied Physics, vol. 84, No. 2, Jul. 15, 1998, pp. 940-944.

Partial Search Report issued in related PCT Application No. PCT/US18/52435 dated Feb. 5, 2019.

International Search Report and Written Opinion dated Mar. 27, 2019 in related PCT Application No. PCT/US18/52435.

* cited by examiner

SWITCHABLE SUPERCONDUCTING JOSEPHSON JUNCTION DEVICE FOR LOW ENERGY INFORMATION STORAGE AND PROCESSING

PRIORITY INFORMATION

This application claims priority from provisional application Ser. No. 62/561,791 filed Sep. 22, 2017 and provisional application Ser. No. 62/686,903 filed Jun. 19, 2018, which are incorporated herein by reference in their entireties.

SPONSORSHIP INFORMATION

This invention was made with Government support under Grant Nos. DMR1700137 and DMR1207469 awarded by the National Science Foundation (NSF), and under Grant No. N00014-16-1-2657 awarded by the Office of Naval Research. The Government has certain rights in the invention.

BACKGROUND OF THE INVENTION

The invention relates to the field of Josephson junction, and in particular to an exchange field switchable Josephson junction where the Josephson tunneling between two superconducting layers could be controlled.

The Josephson junction (JJ) is a versatile device which has found wide application as field sensors, measurement standards or in quantum computing, among others. It consists of superconducting electrodes separated by a non-superconducting link (insulator, normal metal, or the like) in which a (Josephson) current flows without dissipation.

There is a particular interest in the study of Josephson junctions with magnetic inter-layers. The interplay between the superconducting correlations and the exchange field in ferromagnetic materials lead to striking phenomena as $0$-$\pi$ transition, long range triplet superconductivity and anomalous Josephson currents. These phenomena and the ability of JJs to switch between super- and normal currents with high reproducibility and at high rates, make magnetic Josephson junctions attractive for the emerging field of superconducting spintronics, building of cryogenic memories, and qubits for quantum computers.

SUMMARY OF THE INVENTION

According to one aspect of the invention, there is provided an exchange field junction. The exchange field junction includes a plurality of ferromagnetic insulators that are defined by their respective magnetic alignments. A first superconducting layer is positioned between two of the ferromagnetic insulators, wherein the conductive state is controlled by the relative magnetization orientation of the ferromagnetic insulators where the first superconducting layer is superconducting when the two magnetizations are aligned in antiparallel but it turns normally conducting when the magnetic alignment is parallel. A second superconducting layer is adjacent one of the ferromagnetic layers, wherein Josephson tunneling occurs between the first superconducting layer and second superconducting layer across one of the ferromagnetic layers.

According to another aspect of the invention, there is provided a switchable Josephson junction. The switchable Josephson junction includes a plurality of ferromagnetic insulators that are defined by their respective magnetic alignments. A first superconducting layer that is positioned between any two of the ferromagnetic insulators, wherein the conductive state is controlled by the relative magnetization orientation of the ferromagnetic insulators where the first superconducting layer is superconducting when the two magnetizations are aligned in antiparallel but it turns normally conducting when the magnetic alignment is parallel. A second superconducting layer is adjacent one of the ferromagnetic layers, wherein Josephson tunneling occurs between the first superconducting layer and second superconducting layer across one of the ferromagnetic layers.

According to another aspect of the invention, there is provided a method of forming an exchange field junction. The method includes providing a plurality of ferromagnetic insulators that are defined by their respective magnetic alignments, and positioning a first superconducting layer between any two of the ferromagnetic insulators. Also, the method includes positioning a second superconducting layer that is adjacent one of the ferromagnetic layers, wherein Josephson tunneling occurs between the first superconducting layer and second superconducting layer across one of the ferromagnetic layers having a magnetic alignment that is antiparallel relative to the other, wherein the magnetic alignment is controlled by the conducting state of the first superconducting layer.

According to another aspect of the invention, there is provided a switchable Josephson junction. The switchable Josephson junction includes a plurality of ferromagnetic insulators that are defined by their respective magnetic alignments. A first superconducting layers is positioned between any two of the ferromagnetic insulators. The conductive state is controlled by the relative magnetization orientation of the neighboring ferromagnetic insulators where the first superconducting layer is superconducting when the two magnetization are aligned in antiparallel but it turns normally conducting when the two magnetization are parallel. A second superconducting layer that is positioned between any two of the ferromagnetic insulators. The conductive state is controlled by the relative magnetization orientation of the neighboring ferromagnetic insulators where the second superconducting layer is superconducting when the two magnetization are aligned in antiparallel but it turns normally conducting when the two magnetization are parallel. Josephson tunneling is controlled by relative magnetic alignment of the three ferromagnetic insulators occurs between the first superconducting layer and second superconducting layer when they are superconducting states across the ferromagnetic layers positioned between the first superconducting layer and second superconducting layer. The tunneling behavior have four states depending on the relative magnetization orientation.

According to another aspect of the invention, there is provided a method of forming an exchange field junction. The method includes providing a plurality of ferromagnetic insulators that are defined by their respective magnetic alignments, and positioning a first superconducting layer between any two of the ferromagnetic insulators. Also, the method includes positioning a second superconducting layer between any two of the ferromagnetic insulators. Josephson tunneling occurs between the first superconducting layer and second superconducting layer across the ferromagnetic layers positioned between the first superconducting layer and second superconducting layer where the ferromagnetic layers have magnetic alignments that are not all the same. The magnetic alignments are controlled by the conducting state of the first superconducting layer and second superconducting layer.

According to another aspect of the invention, there is provided a switchable Josephson junction. The switchable Josephson junction includes a junction that comprises at one least ferromagnetic insulator. A first topological insulator (TI) layer is positioned on the junction a first high atomic number (Z) layer or a bilayer that comprises a second TI layer and a plurality of second high Z layers that is adjacent to the at least one ferromagnetic insulator. A dielectric layer is placed on the first TI layer or the first high Z layer, or the bilayer. A metal electrode adjacent to the dielectric layer, wherein the magnetization of the at least one ferromagnetic insulator is switched by applying a gate voltage between the first TI layer or first high Z layer or the bilayer and the metal electrode. The gate voltage tunes the chemical potential of the first TI layer and/or the first high Z layer to change the interface properties between the at least one ferromagnetic layer and the TI layer or the first high Z layer via spin orbit coupling, and thus can cause magnetization switching of the ferromagnetic insulator.

DETAILED DESCRIPTION OF THE INVENTION

Figure 1A:
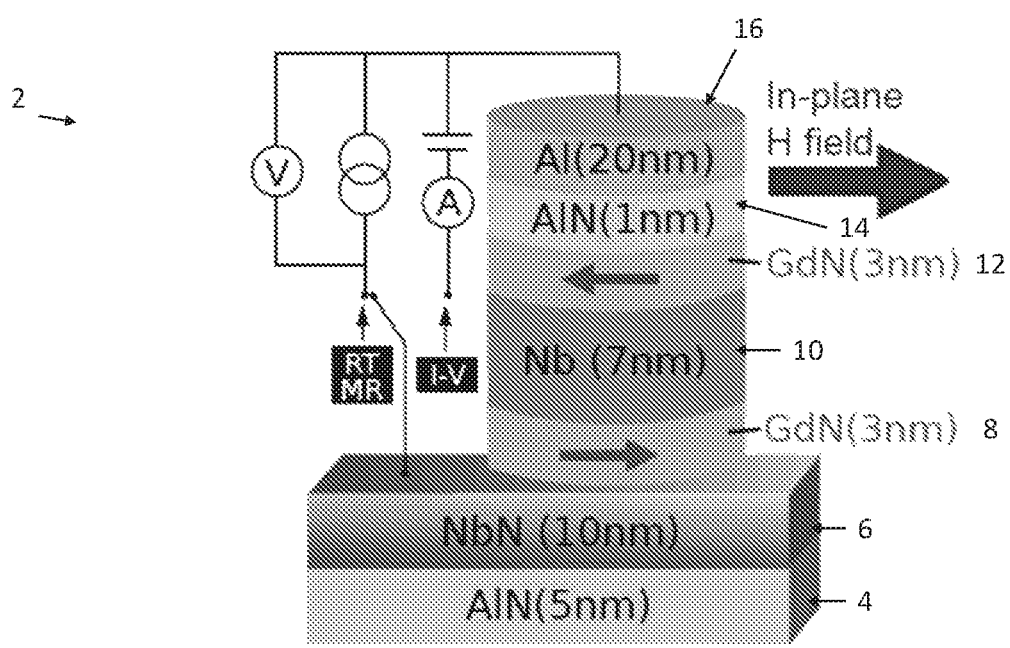
FIGS. 1A-1B are a schematic diagram illustrating the sample structure and transport measurements used in accordance with the invention and a graph illustrating temperature dependence of the resistance (zero field cooled) of a structure formed in accordance with the invention.

The invention describes an exchange field switchable Josephson junctions where the Josephson tunneling between two superconducting (SC) layers (Nb and NbN) could be controlled by the relative magnetic alignment of two GdN ferromagnetic insulator layers sandwiching the Nb layer. The junction's working principle is based on the control of the superconducting state of one of the layers by means of the interfacial exchange field of the magnetic GdN layers. At zero field and low temperatures, the ground state of the junctions corresponds to an antiferromagnetic configuration of the two GdN layers that coexist with the superconducting state of the Nb layer. By applying an external field the GdN layers are switched to a parallel configuration, thereby suppressing the superconductivity in Nb and hence the Josephson current via interfacial exchange. This switchable Josephson junction may be useful for integrated superconducting spintronics and quantum circuits.

The combination of ferromagnetic insulators (FI) and superconductors can be very useful. On the one hand the strong interfacial exchange field (IEF) due to s-d and s-f exchange between the conducting electrons of the SC and the localized magnetic moments of the FIs, leads to a full development of the triplet component and spin-dependent density of states. On the other hand, because there is no leakage of Cooper pairs into the FI the superconducting gap is quite robust, and its magnitude is mainly controlled by the strength of the IEF via the paramagnetic effect. FI bilayers offer exceptionally high magnetic fields localized at atomically sharp interfaces.

For a FI such as GdN, which involves the rare-earth element Gd, the localized f electrons provide the IEF which in a superconductor can propagate over the superconducting coherence length. This exchange field is equivalent to a space inhomogeneous Zeeman field. By sandwiching a SC film between two such magnetic layers and keeping the SC layer's thickness below the coherence length, the effect of the exchange interactions at each interface sum up and can be greatly enhanced. The use of FIs has been recently shown to result in the passive control of superconducting or topological insulator layers in bilayers or spin valves. Moreover, an FI located between two superconducting electrodes may serve as a spin-filter, giving rise to spin-filtering Josephson junction. Spin filtering Josephson junctions may exhibit a new type of 0-π transition, even pure triplet currents, and anomalous Josephson currents ('0-junctions).

The invention utilizes FI/SC/FFSC Josephson junctions with a built-in exchange driven magnetic switch. The proposed switchable Josephson junction device is based on the IEF induced in a superconductor sandwiched between two FI layers. In the FT/SC/FT structure, defined as a superconducting spin valve (SSV), the superconducting transition temperature $T_C$ of the SC spacer depends on the relative orientation of the magnetization of the two FI layers, referred to as the superconducting spin switch effect (SSE). One finds that at zero field the ground state corresponds to an AP configuration of the magnetization M in the Fi layers. In this configuration the net IEF in the superconductor between the FI layers cancels out and does not affect the superconductivity. Therefore a Josephson current can flow.

By applying a relative small magnetic field one can switch the two FI layers towards a parallel (P) alignment of magnetization. In this case the average IEF experienced by the Cooper pairs destroys superconductivity in the SC spacer layer and consequently no supercurrent flows. Thus, the combination of the SSE effect and a FI tunneling barrier results in a passively controlled Josephson junction behavior that could be used as a non-volatile memory and logic superconducting spintronics based on IEF. Moreover, the invention could take us towards the full-triplet Josephson junction which would include a third FI layer.

The inventive structures are fabricated by reactive sputtering in an ultra-high vacuum (UHV) system on thermally oxidized Si substrates at room temperature starting with a 1 nm thick seed layer of $Al_2O_3$. FIG. 1A shows the layer sequence 2 of the sample is AlN(5 nm)/NbN(10 nm)/GdN(3 nm)/Nb(7 nm)/GdN(3 nm)/AlN(1 nm)/Al(20 nm) with the numbers in parentheses corresponding to thickness in nm. In these structures, the SC electrodes (NbN and Nb) 4, 10 are separated by 3 nm GdN tunnel barriers 8, 12. The second GdN layer 8 situated over the Nb layer 6, together with the tunneling barrier, sandwiches the Nb layer 6 allowing us to control its superconducting state via the relative magnetic configuration (P or AP) of the GdN magnetic moments.

The optimum thicknesses of both GdN layers 8, 12 were arrived at by systematically fabricating junctions with different Nb and GdN thicknesses, as well as by different growth conditions, until Josephson tunneling was observed. The combination of a thin AlN layer 14 followed by a thick Al layer 16 was found to be the best capping to protect samples from degradation while preserving vertical transport.

After deposition, the samples were patterned by optical lithography and ion milling into circular junctions with diameters ranging from 10 to 80 μm. The milling was carried out down to the bottom NbN layer 6, leaving it intact. The pillar structure was protected by 20 nm of $Al_2O_3$ filler, and a 100 nm thick Al contact pad of 1 mm² area was fabricated through an additional lithography/sputtering step. Independent electrical contact with indium was made to each SC layer via the top electrode pad (Nb) 10 and by scratching a corner of the wafer to expose NbN 6.

Figure 1B:
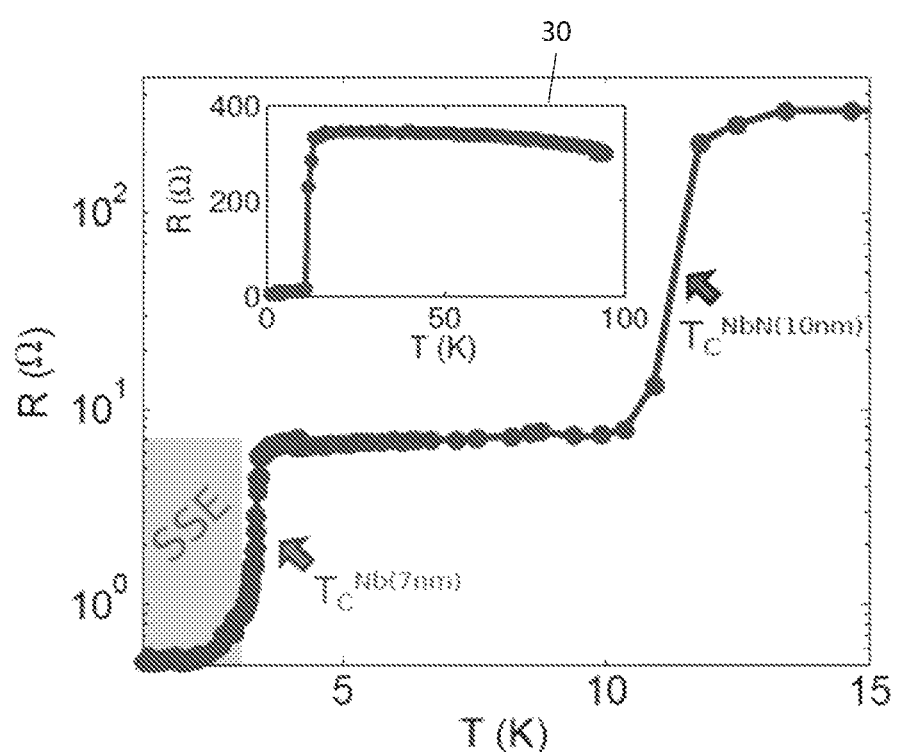

FIG. 1B shows the graph of the zero-field cooled, temperature dependence of the resistance in a 10 μm device (essentially a 3-terminal measurement), with an applied current of 10 μA. Two clear drops in resistance as temperature decreases are attributed to the superconducting transition temperatures of the 10 nm NbN layer ($T^{NbN(10)}$=11.3K) and the 7 nm Nb layer ($T^{Nb(7)}$=3.2K), where each $T_C$ was estimated by the half-height criteria. The inset 30 shows how the resistance in the 10 μm NbN film in the sample, below 90 K increases as the temperature goes down until it goes superconductor. For this device, the highest resistance value achieved before the first SC transition is 343Ω. The drop from 343 to 7 when NbN becomes SC can be accounted for in order of magnitude by the spread resistance in the NbN layer experienced between the scratched indium contact and the bottom pillar. When the SC transition of the Nb layer takes place, the resistance further drops down to 0.5Ω, which we attribute to the occurrence of Josephson tunneling. The residual 0.5Ω resistance could be ascribed to a rougher top AlN/GdN layer.

Figure 2A:
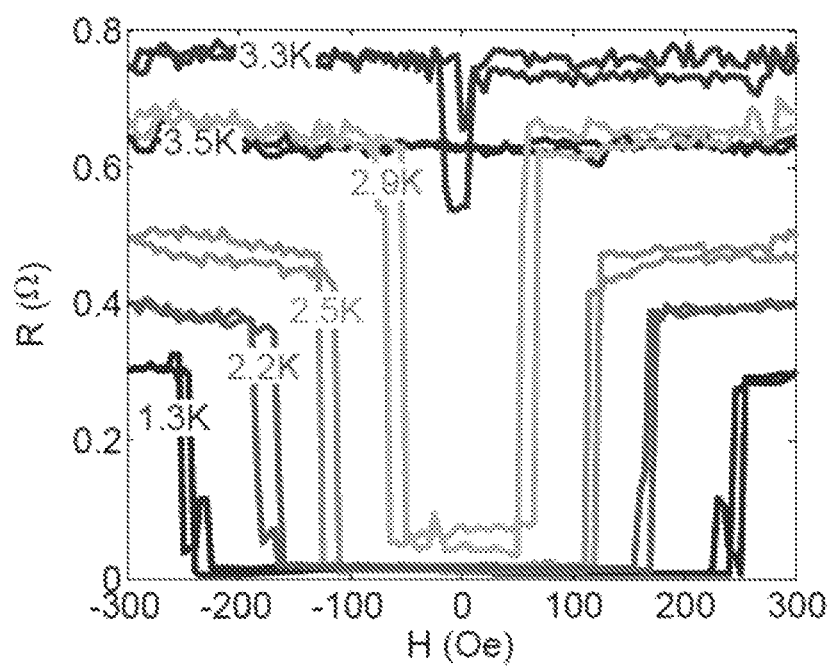
FIGS. 2A-2B are graphs illustrating field and temperature dependences of a device formed in accordance with the invention.

The sample was then warmed up above TNb(7) and cooled again while measuring magnetoresistance (MR) curves with decreasing temperature at an applied current of 10 μA and an in-plane magnetic field. A residual resistance in the AP state at the lowest temperature $R_{res,1.3K}^{AP}$=0.05Ω was observed, and subtracted from all measurements shown in FIGS. 2A-2B for simplicity of analysis. FIG. 2A shows a graph when the temperature reaches the superconducting transition of the Nb layer, the MR signal begins exhibiting the superconducting spin switching effect namely a low and high resistance state not present for 3.5 K but beginning to appear at 3.3 K. This change in resistance is attributed to result from the AP and P alignment of the GdN magnetizations, respectively. No MR signal was observed for higher temperatures.

Figure 2B:
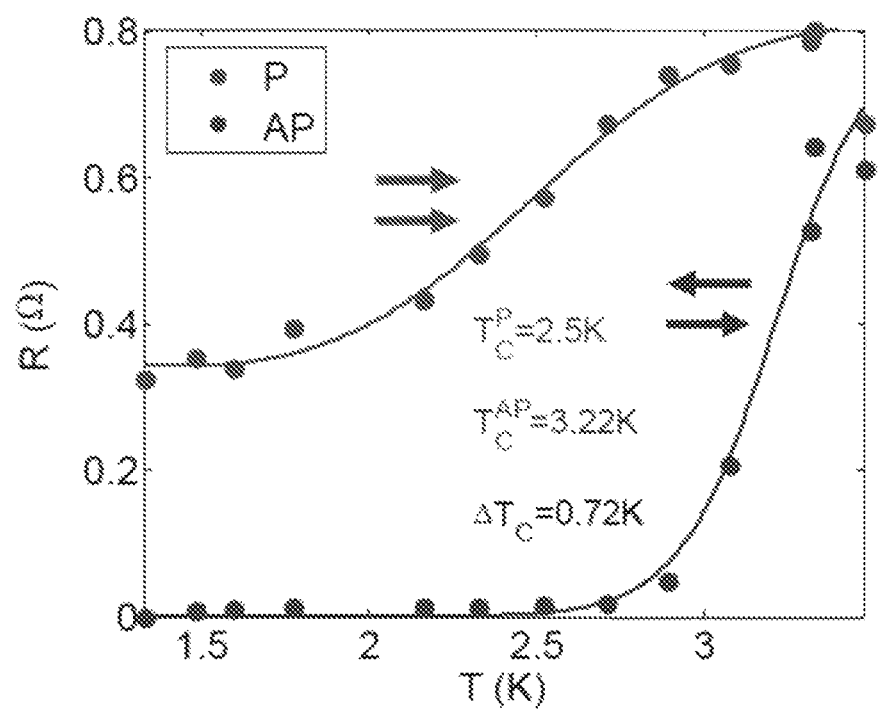

FIG. 2B is a graph showing when the minimum (AP) and maximum (P) resistance values as a function of temperature obtained from the constant temperature MR curves. The critical temperature $T_C^{AP}$ is obtained by fitting the AP state curve with the equation $$R(T) = \frac{R_N}{2}\left[1 + \tanh\frac{T - Tc}{\delta T}\right] + R_{res},$$

where $R_N$ is the resistance in the normal state, $T_C$ the critical temperature, δT the width of the transition, and $R_{res}$ the residual resistance. There is no residual resistance extracted for the AP state as it has already been subtracted. For the P state, $R_{res}^P$≅≃0.35Ω, which could be due to the stray-field (or dipolar coupling) between the two GdN layers that suppresses the superconducting state of the Nb layer. As can be seen, the AP and P states present critical temperatures $T_C^{AP}$=3.22K and $T_C^P$=2.5K, yielding a difference of ΔTC~0.7 K in the SC transition temperature due to the different IEFs induced by the GdN layers. Note that the low resistance or AP state appears for small or no applied magnetic field. The MR loop is symmetric with respect to the field, and the low resistance region widens up to higher magnetic fields as the temperature decreases, as shown in FIG. 2A. This can be attributed to an antiferromagnetic (AF) coupling between FIs for which the coupling strength increases as the temperature reduces. One can observe similar MR curves for junctions of different diameter on the same wafer.

The appearance of an AF coupling has been previously reported in GdN/Nb/GdN trilayers for temperatures below the SC transition of the Nb spacer. In order to test this, several GdN/Nb/GdN trilayer control samples were fabricated and obtain the same MR behavior as in FIG. 2A. The SC transition temperature of the sandwiched Nb layer, the AF coupling strength and its influence on the MR signal depend on the absolute and relative thicknesses of the GdN layers and the Nb spacer. For different GdN and Nb thicknesses the appearance of the AF coupling can be shifted further below the SC transition temperature so both remnants AP and P states (i.e. present at zero field) can be obtained for some range of temperatures, which is desired for a technological application. However, in the case of the inventive JJs, the thickness of the layers for which once can achieve Josephson tunneling yield an AF coupling which prevents obtaining both remnants P and AP states.

Figure 3A:
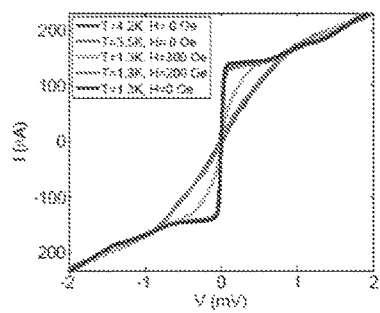
FIG. 3A is a graph illustrating the current-voltage plots at different temperatures and applied magnetic fields for a device formed in accordance with the invention.

With R vs T and MR data on hand, we then proceeded to determine the current-voltage (I-V) characteristics of our JJs by varying the applied voltage and measuring the current passing through the sample. FIG. 3A demonstrates different I-V curves for the same 10 μm junction at different temperature and magnetic field values. As expected, for temperature above $T_C^{Nb(7)}$ the junction presents no sign of Josephson current. However, at 1.3 K and zero-field, the junction presents a clear Josephson effect with a critical current of around 140 μA. Further, if one uses FIG. 2A as a guide, at 1.3 K, the zero-voltage state remains up to fields ±250 Oe. In fact, the curve shown in FIG. 3A for 200 Oe differs very little from the I-V obtained with no applied field whereas for 300 Oe there the critical current is strongly suppressed and the I-V characteristics are closer to the normal state ones (above 3.3 K) I-Vs. The negative or positive fields as well as the magnetic history do not influence the I-Vs up to around 230 Oe at 1.3 K. For brevity, only positive field results are shown.

Figure 3B:
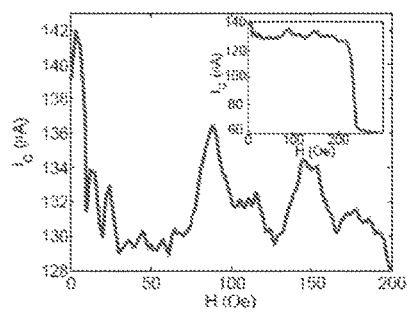
FIG. 3B is a graph illustrating field dependence of $I_C$ at T=1.3 K.
Figure 3C:
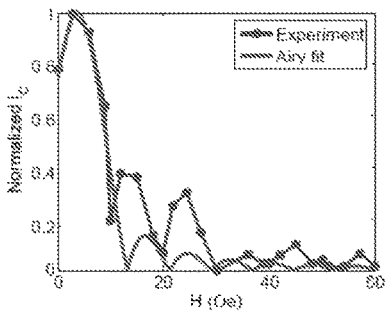
FIG. 3C is graph illustrating the fit of the Airy pattern expected for circular Josephson junctions to the normalized $I_C$ at low fields.

In FIG. 3B, it shows the dependence of the Josephson critical current IC on the applied in-plane field (step size between 1 and 3 Oe) at T=1.3K IC is extracted at each field by fitting the I-V curve with V=RNpI2−I2 C for I≤IC 22 where $R_N$ is the resistance of the junction in the normal state. The inset of FIG. 3B shows the full range, where a sharp drop in critical current takes place at the switching field (around 250 Oe) between the AP and P states. As can be seen in FIG. 3C, the $I_C$ oscillations at low fields can be compared to the Airy pattern, theoretically expected for a circular junction of a given radius. The critical current for fields below 60 Oe from FIG. 3B is normalized between 0 and 1 for simplicity, and fit using the equation $|2J_1(x)/x|$ where $J_1$ is a Bessel function of first kind and $x=2\pi(H-H_{off})/H_0$ where $H_{off}$ is the shift in field of the Fraunhofer pattern and $H_0$ the oscillation period. The results of the fitting are H0=14.9 and Hoff=3.8 Oe.

If one now take this value of $H_0$ and consider that the flux through the junction obeys $\phi_0=(2\lambda+t)du_0H_0$ where $\phi_0$ is the magnetic flux quantum, t=3 nm the junction barrier thickness, d=10 μm the junction diameter, one can estimate λ the average field penetration depth of the junction. A value of λ=68 nm is obtained, which is a reasonable result as it is an intermediate value of λ for the two different materials used as SC electrodes ($\lambda_{Nb}$=39 nm, $\lambda_{NbN}$=194 nm). Although the $I_C(H)$ dependence is far from a Fraunhofer pattern, some conclusions can be extracted if one zooms in the low-field region and IC normalized, as shown in FIG. 3C.

First, one notes that the maximum is shifted from zero field, which is a manifestation of the finite magnetization of the barrier GdN layer between the superconductors. Secondly, although one distinguishes after normalization of the curve [see FIG. 3C] an oscillation of IC that resembles the Airy pattern expected for circular Josephson junctions, this pattern is distorted when the applied field gets larger.

Moreover, the minima of IC do not vanish at any field. These observations may be attributed to the highly asymmetric distribution of the current density through the junction. The asymmetry is field dependent: At very low fields the junction is in an AF configuration, and one can assume that magnetic disorder is low. This may explain the "Fraunhofer-like" behavior of the $I_C(H)$ curve in FIG. 3C for H<40 Oe. As the applied magnetic field becomes higher, it does not only affect the spatial behavior of the superconducting phase but also the magnetic configuration of the ferromagnetic layers. At higher field the AF configuration becomes unstable and the GdN layers tend towards the P configuration and thus forms a complex domain structure.

Furthermore in a multi-domain state, stray fields from the domain walls lead to a highly non-uniform superconducting order parameter, hence to random interference pattern and to the highly nonuniform current density. This asymmetry could cause the non-vanishing minima of IC. The non-zero Josephson current in the AP state fields above 250 Oe) is a result of the fitting, since it can be argued there is no Josephson current owing from the curvature of the IV curve at T=1:3 K and H=300 Oe.

Figure 4A:
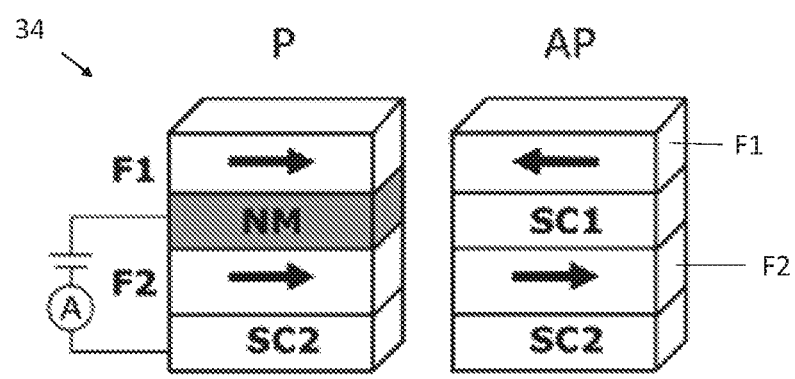
FIG. 4A is a schematic diagram illustrating a switchable Josephson junction formed in accordance with the invention.

FIG. 4A describes a switchable Josephson junction 34 having two superconducting layers (SC1 and SC2) where SC1 is sandwiched between two ferromagnetic insulator layers (F1 and F2). At a temperature below the critical superconducting temperature of the SC layers, the conducting state of SC1 can be switched between a normal metal (NM) and a superconductor by the relative magnetic alignment of the neighboring FI layers. When the magnetization of the layers F1 and F2 are oriented parallel (P state), the total magnetic exchange field experienced by SC1 can destroy the superconducting state of the layer so it behaves as a normal metal.

Figure 4B:
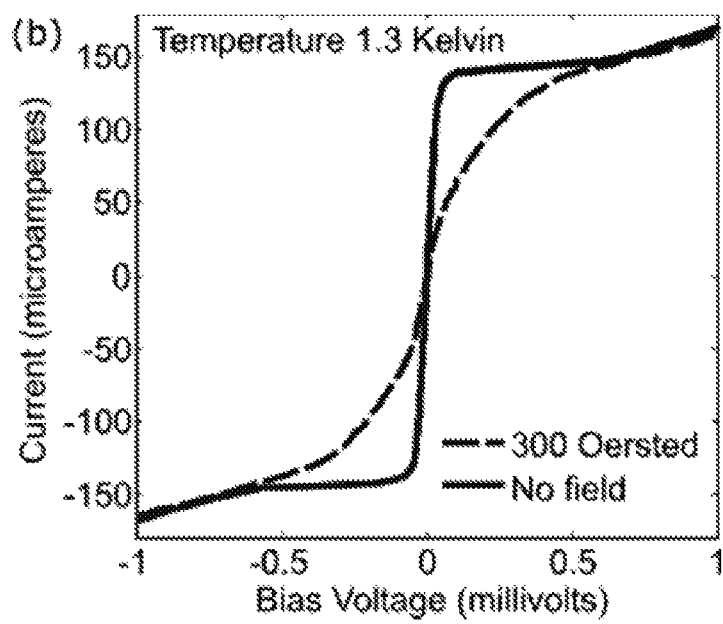
FIG. 4B is a graph illustrating the experimental evidence at a temperature of 1.3 Kelvin of the switchable Josephson junction.

In the antiparallel case (AP state), the magnetic fields from the magnetic layers cancel out and SC1 remains superconducting. FIG. 4B shows the experimental evidence at a temperature of 1.3 Kelvin of the switchable Josephson junction, with a stacking structure of AlN(5 nm)/SC2=NbN (10 nm)/FI2=GdN(3 nm)/SC1=Nb(7 nm)/FI1=GdN(3 nm)/AlN(1 nm)/Al(20 nm). The current-voltage plots demonstrate the device can operate as a Josephson junction (SC/I/SC junction) in the AP state, which is observed when no external magnetic field is applied. When a field of 300 Oersted is applied, the P state is achieved and the device behaves as a NM/I/SC junction, exhibiting a large increase in resistance, that is, a larger voltage is necessary to obtain a current of 100 microampers compared to the AP state.

Figure 5A:
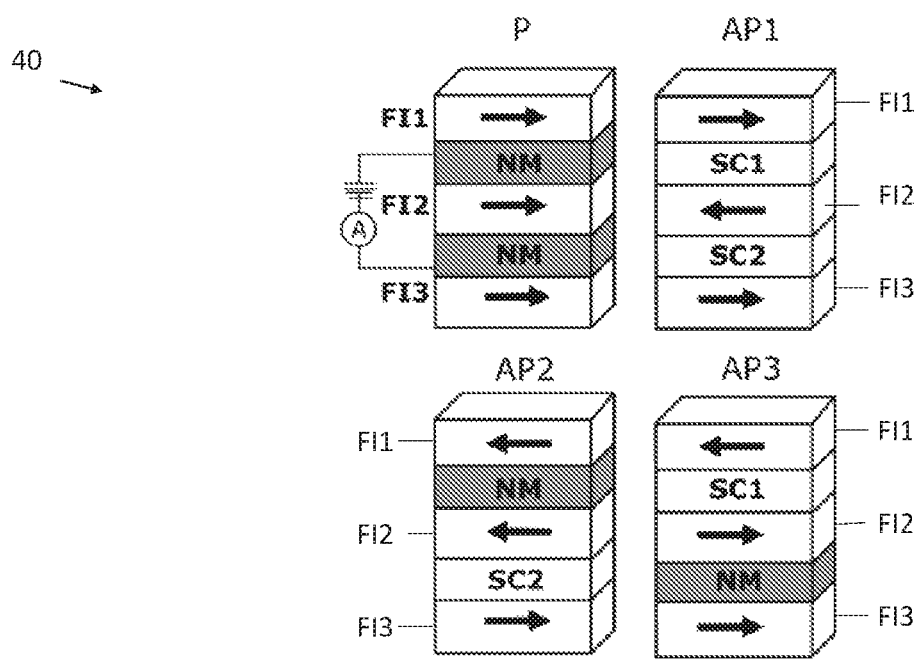
FIG. 5A is a schematic diagram illustrating a dual switchable Josephson junction formed in accordance with the invention.
Figure 5B:
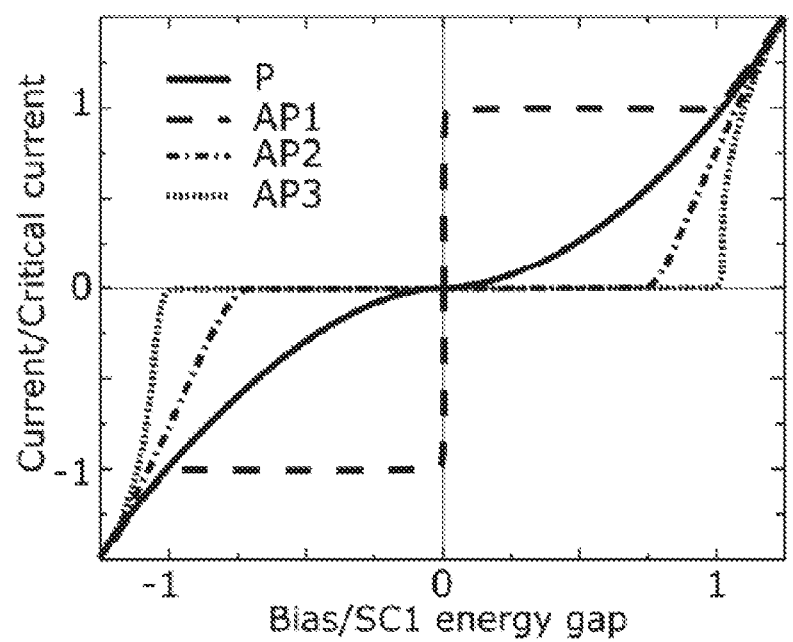
FIG. 5B is a graph illustrating expected current-voltage plots in the four different magnetic states.

FIG. 5A shows an inventive dual switchable Josephson junction 40, where an additional FI layer FI3 can be used to control the conductive state of SC2 as well. If the FI layers, FI1, FI2, and FI3, are fabricated so their coercive fields (Hc) obey Hc2<Hc1<Hc3 and SC2 is of a different superconducting material than SC1, then four different magnetic states (P, AP1, AP2, and AP3) can be achieved which lead to four different resistive states. If the metal used for SC1 and SC2 is the same, then AP2 and AP3 states are equivalent. Alternatively, ferromagnetic metals could be used in place of ferromagnetic insulators. FIG. 5B shows the expected current-voltage plots in the four different magnetic states. In this plot, the energy gap of SC2 is smaller than of SC1.

Figure 6A:
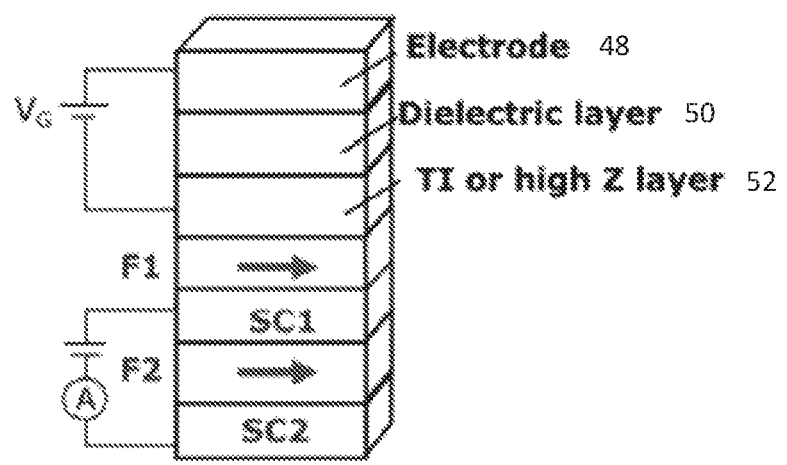
FIGS. 6A-6B are schematic diagrams illustrating switchable Josephson junctions which further function via electrical switching of the magnetization of a ferromagnetic insulator.
Figure 6B:
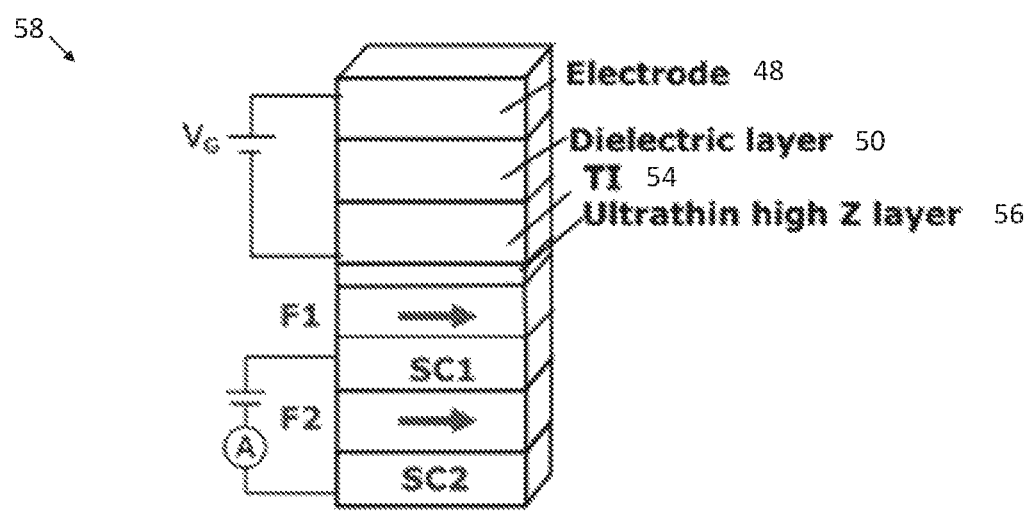

FIGS. 6A-6B shows an inventive switchable Josephson junctions which further function via electrical switching of the magnetization of F1. These devices are switchable Josephson junction devices 46, 58 equipped with additional layers including a gate electrode 48, dielectric layer 50, and a topological insulator or high atomic number (Z) material layer 52, as shown in FIG. 6A, and a TI layer 54 and an ultrathin sprinkled high Z layer 56 on the F1, as shown in FIG. 6B. The high Z material have high values of atomic number, for example, can be Pt, Pd, W, Ta, Au, Pb, Bi and so forth.

To switch the magnetization of F1, one can apply a voltage of VG. This voltage tunes the chemical potential of TI (and/or high Z) to change the interface properties between FI and TI (or high Z) layers via spin orbit coupling, and thus can cause magnetization switching of F1. These devices are operational without the use of current generated external Oersted magnetic field. The switchable Josephson tunneling characteristics is the same as that in FIG. 1.

Figure 7A:
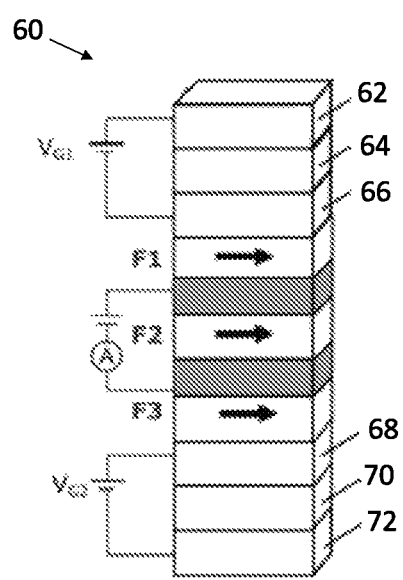
FIGS. 7A-7C are schematic diagrams illustrating dual switchable Josephson junctions (DSJJ) formed in accordance with the invention.
Figure 7B:
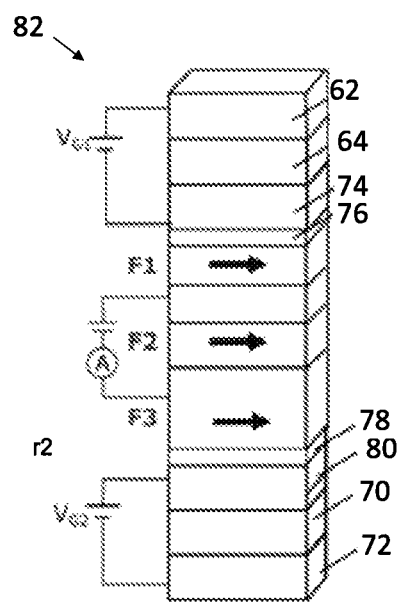
Figure 7C:
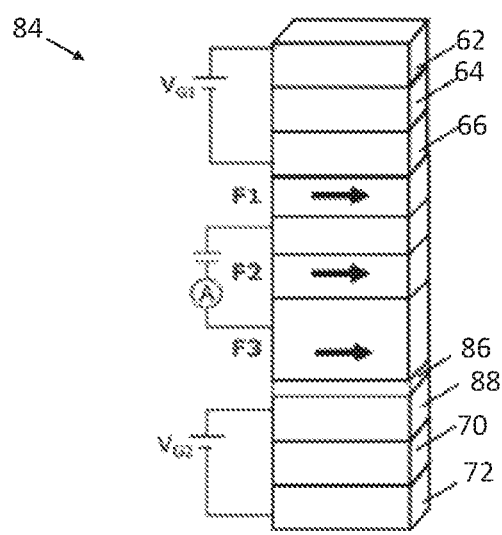

FIGS. 7A-7C shows a dual switchable Josephson Junctions (DSJJ) which can also function via electrical switching of the magnetizations of F1 and F3. These devices are dual switchable Josephson junction devices 60, 82 equipped with two sets of the additional multilayer adjacent F1 and F3, and the multilayer include gate electrodes 62, 70, dielectric layers 64, 70, and a TI or high Z layers 66, 68, as shown in FIG. 7A and a TI layer 80 and ultrathin sprinkled high Z layer 78, as shown in FIG. 7B.

In addition, FIG. 7C shows a DSJJ 84 with two gate electrodes 62, 72, dielectric layers 64, 70, and a TI or high Z layer 66 on F1 (or F3) and a TI layer 88 and an ultrathin sprinkled high Z layer 86 on F3 (or F1). The high Z material have high values of atomic number, for example, can be Pt, W, Ta, Au, Pb, Bi and so forth. To switch the magnetizations of F1 and F3, we apply a voltage of VG1 and VG2.

These voltages tune the chemical potential of TI (and/or high Z) to change the interface properties between FI and TI (and/or high Z) layers via spin orbit coupling, and thus can cause magnetization switching of F1 and F3. These devices are operational without the use of current generated external Oersted magnetic field. The dual switchable Josephson tunneling characteristics is the same as that in FIG. 2B.

The invention utilizes fabricated Josephson junction structures which incorporated an internal exchange driven magnetic switch based on the superconducting spin switching effect. The use of ferromagnetic insulator layers to sandwich one of the superconducting electrodes of the junction, with one FI additionally acting as a tunneling barrier, allow the control of the superconducting state of one of the electrodes through the interfacial exchange field. This control of the superconducting state results in a fully-switchable Josephson junction, between superconductor-insulator-superconductor to superconductor-insulator-normal metal tunneling in the absence of an applied magnetic field. The vertical geometry of our device opens an opportunity to integrate such valves into superconducting circuits in analogy to magnetic tunnel junctions. Moreover, by adding an additional FI layer in the same setup one may be able to realize π– and φ_0– junctions predicted in recent works.

Although the present invention has been shown and described with respect to several preferred embodiments thereof, various changes, omissions and additions to the form and detail thereof, may be made therein, without departing from the spirit and scope of the invention.

What is claimed is:

1. An exchange field junction comprising:
    a plurality of ferromagnetic insulators that are defined by their respective magnetic alignments;
    a first superconducting layer that is positioned between two of the ferromagnetic insulators, wherein the conductive state is controlled by the relative magnetization orientation of the ferromagnetic insulators where the first superconducting layer is superconducting when the two magnetizations are aligned in antiparallel but it turns normally conducting when the magnetic alignment is parallel; and
    a second superconducting layer that is positioned between any two of the ferromagnetic layers, wherein Josephson tunneling occurs between the first superconducting layer and second superconducting layer across one of the ferromagnetic layers.

2. The exchange field junction of claim 1, wherein the ferromagnetic insulators comprise gadolinium nitride (GdN).

3. The exchange field junction of claim 1, wherein the first superconducting layer comprises niobium (Nb).

4. The exchange field junction of claim 1, wherein the second superconducting layer comprises niobium nitride (NbN).

5. The exchange field junction of claim 4, wherein the second superconducting layer is formed on an aluminum nitride (AlN) layer.

6. A switchable Josephson junction comprising:
    a plurality of ferromagnetic insulators that are defined by their respective magnetic alignments;
    a first superconducting layer that is positioned between any two of the ferromagnetic insulators, wherein the conductive state is controlled by the relative magnetization orientation of the ferromagnetic insulators where the first superconducting layer is superconducting when the two magnetizations are aligned in antiparallel but it turns normally conducting when the magnetic alignment is parallel; and
    a second superconducting layer that is positioned between any two of the ferromagnetic layers, wherein Josephson tunneling occurs between the first superconducting layer and second superconducting layer across one of the ferromagnetic layers.

7. The switchable Josephson junction of claim 6, wherein the ferromagnetic insulators comprise gadolinium nitride (GdN).

8. The switchable Josephson junction of claim 6, wherein the first superconducting layer comprises niobium (Nb).

9. The switchable Josephson junction of claim 6, wherein the second superconducting layer comprises niobium nitride (NbN).

10. The switchable Josephson junction of claim 9, wherein the second superconducting layer is formed on an aluminum nitride (AlN) layer.

11. A method of forming an exchange field junction comprising:
    providing a plurality of ferromagnetic insulators that are defined by their respective magnetic alignments;
    positioning a first superconducting layer between any two of the ferromagnetic insulators; and
    positioning a second superconducting layer so that it is positioned between any two of the ferromagnetic layers, wherein Josephson tunneling occurs between the first superconducting layer and second superconducting layer across one of the ferromagnetic layers having a magnetic alignment that is antiparrellel relative to the other, wherein the magnetic alignment is controlled by the conducting state of the first superconducting layer.

12. The method of claim 11, wherein the ferromagnetic insulators comprise gadolinium nitride (GdN).

13. The method of claim 11, wherein the first superconducting layer comprises niobium (Nb).

14. The method of claim 11, wherein the second superconducting layer comprises niobium nitride (NbN).

15. The method of claim 14, wherein the second superconducting layer is formed on an aluminum nitride (AlN) layer.

16. A switchable Josephson junction comprising:
    a plurality of ferromagnetic insulators that are defined by their respective magnetic alignments;
    a first superconducting layer that is positioned between any two of the ferromagnetic insulators, wherein the conductive state is controlled by the relative magnetization orientation of the neighboring ferromagnetic insulators where the first superconducting layer is superconducting when the two magnetization are aligned in antiparallel but it turns normally conducting when the two magnetization are parallel; and
    a second superconducting layer that is positioned between any two of the ferromagnetic layers, wherein the conductive state is controlled by the relative magnetization orientation of the neighboring ferromagnetic insulators where the second superconducting layer is superconducting when the two magnetization are aligned in antiparallel but it turns normally conducting when the two magnetization are parallel,
    wherein Josephson tunneling is controlled by relative magnetic alignment of the three ferromagnetic insulators occurs between the first superconducting layer and second superconducting layer when they are superconducting states across the ferromagnetic layers positioned between the first superconducting layer and second superconducting layer, wherein the tunneling behavior have four states depending on the relative magnetization orientation.

17. The switchable Josephson junction of claim 16, wherein the ferromagnetic insulators comprise gadolinium nitride (GdN).

18. The switchable Josephson junction of claim 16, wherein the first superconducting layer comprises niobium (Nb).

19. The switchable Josephson junction of claim 16, wherein the second superconducting layer comprises niobium nitride (NbN).

20. The switchable Josephson junction of claim 19, wherein the second superconducting layer is formed on an aluminum nitride (AlN) layer.

21. A method of forming an exchange field junction comprising:
    providing a plurality of ferromagnetic insulators that are defined by their respective magnetic alignments;
    positioning a first superconducting layer between any two of the ferromagnetic insulators; and
    positioning a second superconducting layer so that it is positioned between any two of the ferromagnetic insulators, wherein Josephson tunneling occurs between the first superconducting layer and second superconducting layer across the ferromagnetic layers positioned between the first superconducting layer and second superconducting layer where the ferromagnetic layers have magnetic alignments that are not all the same,
    wherein the magnetic alignments are controlled by the conducting state of the first superconducting layer and second superconducting layer.

22. The method of claim 21, wherein the ferromagnetic insulators comprise gadolinium nitride (GdN).

23. The method of claim 21, wherein the first superconducting layer comprises niobium (Nb).

24. The method of claim 21, wherein the second superconducting layer comprises niobium nitride (NbN).

25. The method of claim 24, wherein the second superconducting layer is formed on an aluminum nitride (AlN) layer.

26. A switchable Josephson junction comprising:
    a junction that comprises at one least ferromagnetic insulator; and
    a first topological insulator (TI) layer positioned on the junction
    a first high atomic number (Z) layer or a bilayer that comprises a second TI layer and a plurality of second high Z layers that is adjacent to the at least one ferromagnetic insulator; and
    a dielectric layer that is placed on the first TI layer or the first high Z layer, or the bilayer; and
    a metal electrode adjacent to the dielectric layer, wherein the magnetization of the at least one ferromagnetic insulator is switched by applying a gate voltage between the first TI layer or first high Z layer or the bilayer and the metal electrode, the gate voltage tunes the chemical potential of the first TI layer and/or the first high Z layer to change the interface properties between the at least one ferromagnetic layer and the TI layer or the first high Z layer via spin orbit coupling, and thus can cause magnetization switching of the ferromagnetic insulator.

27. The switchable Josephson junction of claim 26, wherein the first high Z layer comprises Pt, Pd, W, Ta, Au, Pb, or Bi.

* * * * *